United States Patent
Yueh et al.

(10) Patent No.: US 10,757,824 B1
(45) Date of Patent: Aug. 25, 2020

(54) ELECTRONIC DEVICE

(71) Applicant: InnoLux Corporation, Miao-Li County (TW)

(72) Inventors: Jui-Jen Yueh, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/733,280

(22) Filed: Jan. 3, 2020

Related U.S. Application Data

(63) Continuation of application No. 16/380,143, filed on Apr. 10, 2019, now Pat. No. 10,561,029.

(51) Int. Cl.
*H01L 25/075* (2006.01)
*H05K 5/00* (2006.01)
*H01L 25/16* (2006.01)
*G09F 9/302* (2006.01)

(52) U.S. Cl.
CPC ....... *H05K 5/0021* (2013.01); *H01L 25/0753* (2013.01); *H01L 25/167* (2013.01); *H05K 5/0017* (2013.01); *G09F 9/3026* (2013.01)

(58) Field of Classification Search
None
See application file for complete search history.

(56) References Cited

U.S. PATENT DOCUMENTS

| | | | |
|---|---|---|---|
| 2011/0089442 A1* | 4/2011 | Jing | H01L 25/0753 257/91 |
| 2014/0175595 A1* | 6/2014 | Oka | H01L 25/0753 257/499 |
| 2017/0294479 A1* | 10/2017 | Cha | H01L 33/0012 |

\* cited by examiner

*Primary Examiner* — Xanthia C Cunningham
(74) *Attorney, Agent, or Firm* — McClure, Qualey & Rodack, LLP

(57) ABSTRACT

An electronic device includes a first electronic module including a first electronic unit and a second electronic unit. The first electronic unit includes a plurality of first electronic elements arranged in a plurality of rows, wherein a top row of the plurality of first electronic elements defines a first base line. The second electronic unit includes a plurality of second electronic elements arranged in a plurality of rows, wherein a top row of the plurality of second electronic elements defines a second base line. A shifting distance S between the first base line and the second base line satisfies $0<S\leq(P_1+P_2)/4$, wherein $P_1$ is defined by two adjacent first electronic elements located in the top row and its adjacent row, and $P_2$ is defined by two adjacent second electronic elements located in the top row and its adjacent row.

20 Claims, 8 Drawing Sheets

ELECTRONIC DEVICE

CROSS REFERENCE TO RELATED APPLICATIONS

This Application is a Continuation application of U.S. application Ser. No. 16/380,143, filed on Apr. 10, 2019, now U.S. Pat. No. 10,561,029, the entirety of which is incorporated by reference herein.

BACKGROUND OF THE INVENTION

Field of the Invention

The present disclosure relates to an electronic device, and in particular, to an electronic device with shifting design.

Description of the Related Art

Display devices have been widely used to dynamically display advertisements. In recent years, multiple display panels have been combined to form a large display device to display advertisements over a large area.

However, while existing display devices have been generally adequate for their intended purposes, they have not been entirely satisfactory in all respects.

BRIEF SUMMARY

The present disclosure provides an electronic device that comprises a first electronic module. The first electronic module comprises a first electronic unit and a second electronic unit. The first electronic unit further comprises a plurality of first electronic elements arranged in a plurality of rows, wherein a top row of the plurality of first electronic elements defines a first base line. The second electronic unit further comprises a plurality of second electronic elements arranged in a plurality of rows, wherein a top row of the plurality of second electronic elements defines a second base line. There is a shifting distance S between the first base line and the second base line. The shifting distance S satisfies $0 < S \leq (P_1+P_2)/4$, wherein $P_1$ is a pitch defined by two adjacent first electronic elements located in the top row and its adjacent row, and $P_2$ is a pitch defined by two adjacent second electronic elements located in the top row and its adjacent row.

BRIEF DESCRIPTION OF THE DRAWINGS

In order to describe the manner in which the above-recited features and other advantages of the disclosure can be obtained, a more particular description of the principles briefly described above will be rendered by reference to specific examples thereof which are illustrated in the appended drawings. It should be understood that these drawings depict only exemplary aspects of the disclosure and are therefore not to be considered to be limiting of its scope. The principles herein are described and explained with additional specificity and detail through the use of the accompanying drawings, in which.

DETAILED DESCRIPTION

Figure 1:
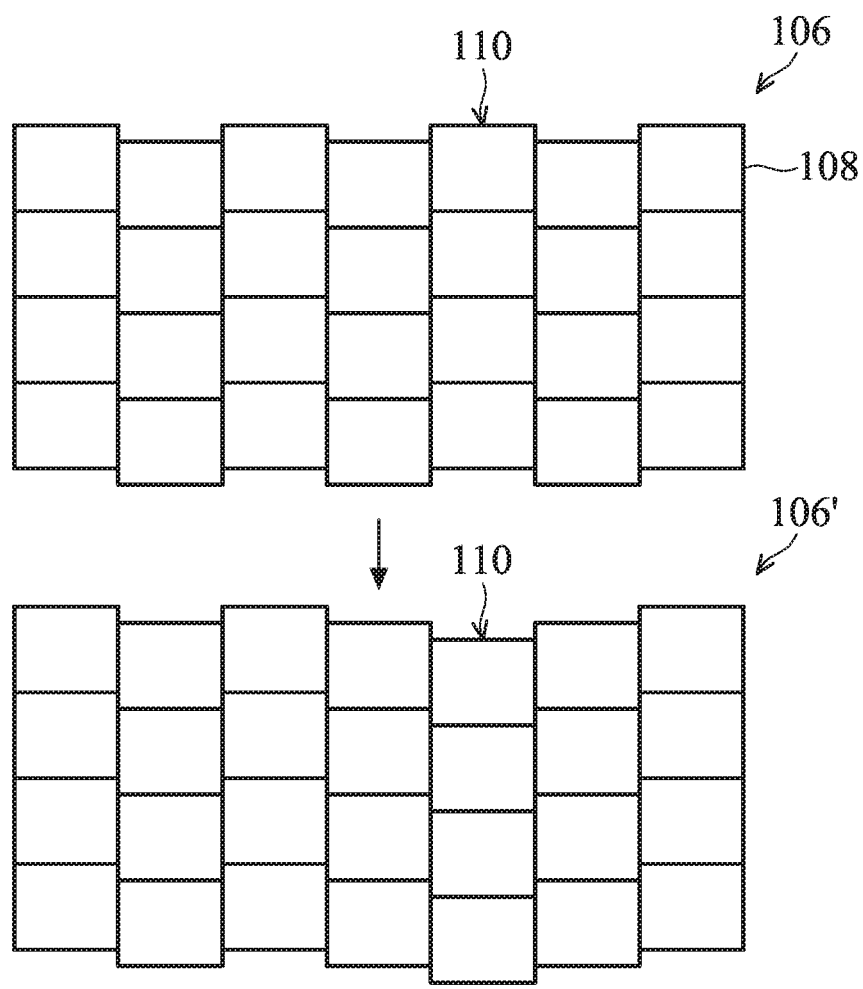
FIG. 1 is a schematic diagram of a display device, in accordance with some embodiments of the present disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The terminology used herein is for the purpose of describing particular embodiments only, and is not intended to be limiting of the present disclosure. As used herein, the singular forms "a", "an" and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore terms, such as those defined in commonly used dictionaries, should be interpreted as having a meaning that is consistent with their meaning in the context of the relevant art, and will not be interpreted in an idealized or overly formal sense unless expressly so defined herein.

The disclosure provides a shifting design. As shown in FIG. 1, an electronic device 106 includes a plurality of electronic modules 108. The electronic modules 108 may be arranged in an array with the shifting design (i.e., columns of the electronic modules 108 are lightly staggered). With this shifting design, when a column of electronic units 108 is shifted due to processing error, this shift caused by the processing error may not be obvious (e.g., the column 110 of the electronic device 106'). In cases where the electronic device has such a shifting design, the tolerance of the shift caused by the processing error becomes high. Therefore, fewer electronic devices will have to be scrapped.

Figure 2:
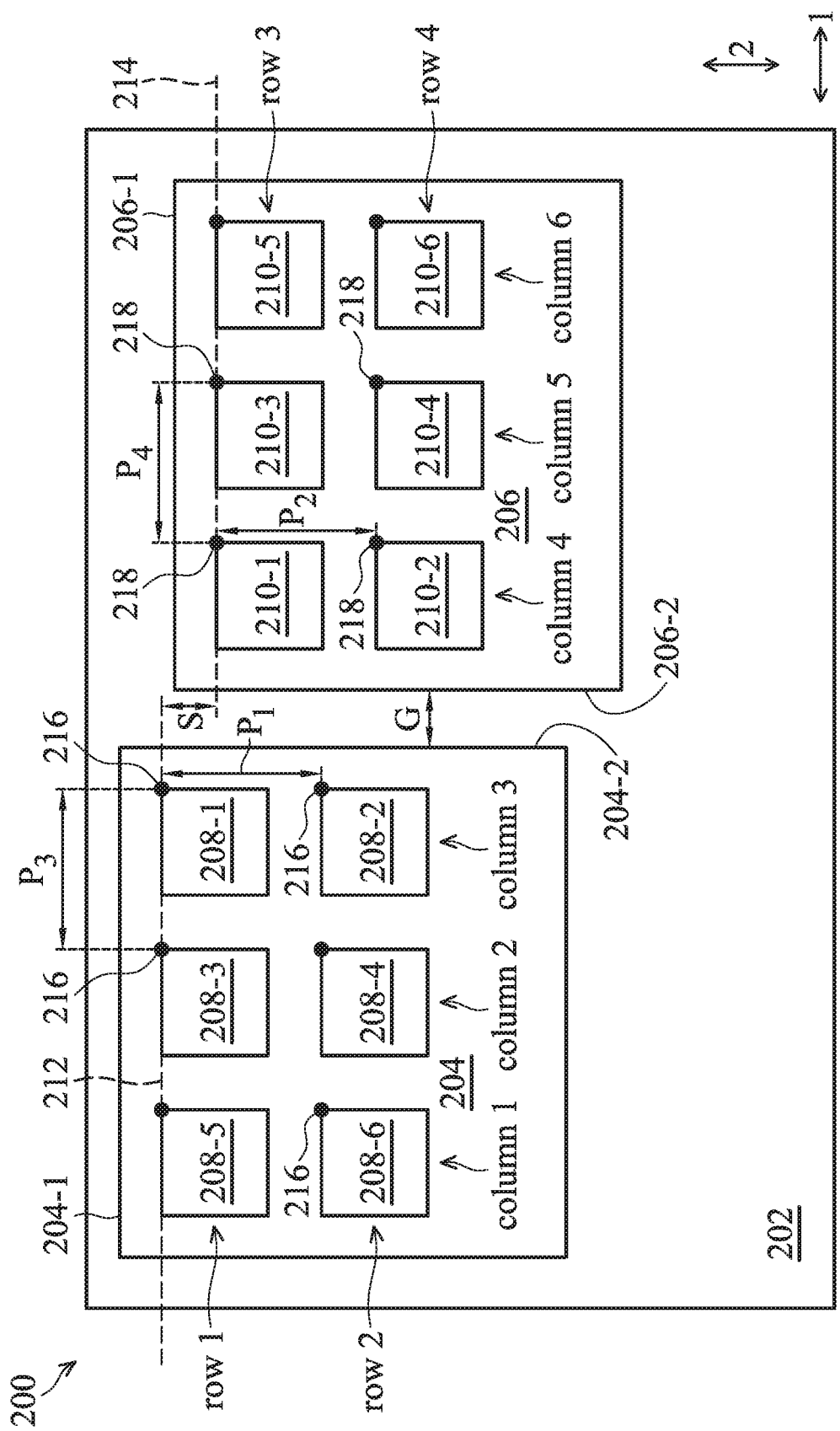
FIG. 2 is a schematic diagram of an electronic device with a shifting design, in accordance with some embodiments of the present disclosure.

FIG. 2 is a schematic diagram of an electronic device with a shifting design, in accordance with some embodiments of the present disclosure. The electronic device 200 includes a substrate 202, a first electronic module 204, and a second electronic module 206. The substrate 202 may be a thin-film transistor (TFT) substrate, a print circuit board (PCB) substrate, a ceramic substrate, a glass substrate, a polymer substrate, a semiconductor substrate, or any suitable substrate including suitable insulating or dielectric material for forming electronic element.

In the present disclosure, the first electronic module 204 and the second electronic module 206 may be disposed (or alternatively formed) on the same side of the substrate 202, and the size of the first electronic module 204 and the second electronic module 206 may be substantially the same or different. The shape of the first electronic module 204 and the second electronic module 206 may be substantially the same or different. In the embodiment, the first electronic module 204 and the second electronic module 206 may be rectangular, but it is not limited thereto. In other embodiments, the size(s) and/or shape(s) of the first electronic module 204 and the second electronic module 206 may vary.

For the purpose of clarity, FIG. 2 illustrates two electronic modules (the first electronic module 204 and the second electronic module 206). It should be understood that there may be two or more electronic modules in the electronic device 200 depending on the needs. For example, there may be two, four, six, nine, twelve, or sixteen electronic modules, but it is not limited thereto. The first electronic module 204 and the second electronic module 206 may include a display panel, a sensing module, an antenna module, other suitable electronic modules, or a combination thereof. In one example, the electronic device 200 may be a tiled display device, a touch display device, a curved display device, a flexible display device, or a combination thereof.

As shown in FIG. 2, the first electronic module 204 and the second electronic module 206 are arranged in an array (1×2 array). In some aspects, the first electronic module 204 is adjacent to the second electronic module 206 in the direction 1 (e.g., along the X-axis). The first electronic module 204 may include a plurality of first electronic units 208 (i.e., the first electronic units 208-1 to 208-6), and the second electronic module 206 may include a plurality of second electronic units 210 (i.e., the second electronic units 210-1 to 210-6). In the present disclosure, the sizes of the first electronic units 208 and the second electronic units 210 may be substantially the same. In this embodiment, the first electronic units 208 and the second electronic units 210 may be square, but it is not limited thereto. For the purpose of clarity, first electronic module 204 and second electronic module 206 each includes six electronic units. It should be understood that the electronic module may have more electronic units. The first electronic units 208 and the second electronic units 210 may include display units, sensors, antenna units, or a combination thereof. The display units may include liquid crystals (LC), organic light-emitting diodes (OLED), inorganic light-emitting diodes (LED), mini light-emitting diodes (mini LED), micro light-emitting diodes (micro LED), quantum dot light-emitting diodes (QLED or QDLED), quantum dots (QD), phosphors, fluorescence, other display units, or a combination thereof, and is not limited thereto. In one example, the first electronic units 208 and the second electronic units 210 may be represented as pixels or sub-pixels of the electronic device 200.

The first electronic units 208 may be arranged in an array in the first electronic module 204, and the second electronic units 210 may be arranged in an array in the second electronic module 206. As an exemplary illustration, in the first electronic module 204, the first electronic units 208 are arranged in two rows (the rows 1 to 2 in the first electronic module 204) in the direction 1 and three columns (the columns 1 to 3 in the first electronic module 204) in the direction 2 (e.g., along the Y-axis) which may be different from the direction 1 (i.e., 2×3 array). For example, the direction 2 may be substantially perpendicular to the direction 1. The rows 1 and 2 of the first electronic units 208 are arranged along the direction 2. Similarly, in the second electronic module 206, the second electronic units 210 are arranged in two rows (the rows 3 to 4 in the second electronic module 206) in the direction 1 and three columns (the columns 4 to 6 in the second electronic module 206) in the direction 2 (i.e., 2×3 array). The rows 3 to 4 of the second electronic module 206 are arranged along the direction 2. In some aspects, one row of first electronic units 208 may be adjacent to another one in the direction 2 (i.e., in the first electronic module 204, the row 1 is adjacent to the row 2 in the direction 2), and one row of second electronic units 210 is adjacent to another one in the direction 2 (i.e., in the second electronic module 206, the row 3 is adjacent to the row 4 in the direction 2). The row 1 of the first electronic units 208 may be referred to as the top row of the first electronic units 208, and it may be closest to the edge 204-1 of the first electronic module 204. Similarly, the row 3 of the second electronic units 210 may be referred to as the top row of the second electronic units 210, and it may be closest to the edge 206-1 of the second electronic module 206.

Figure 3A:
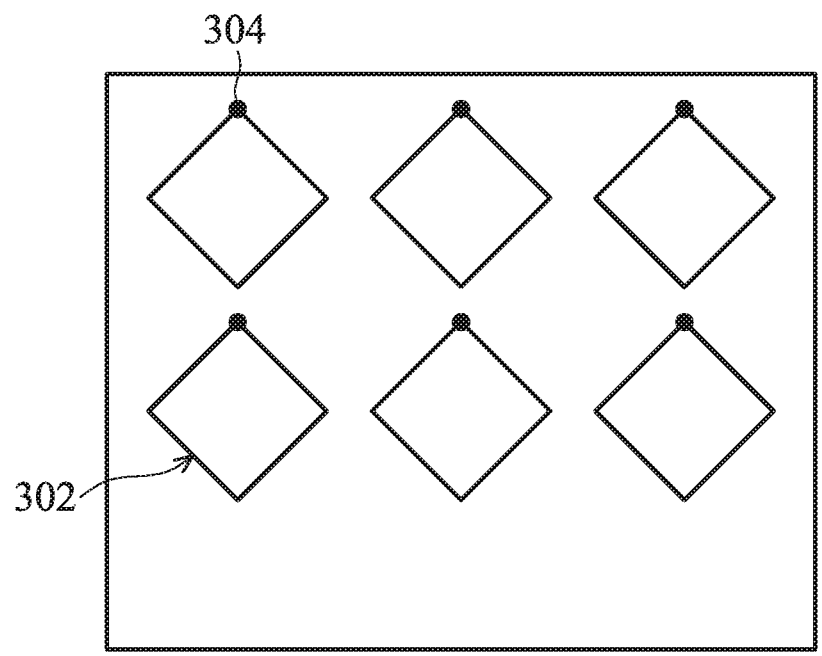
FIGS. 3A-3C is a schematic diagram of an electronic module having electronic unit with different reference point, in accordance with some embodiments of the present disclosure.
Figure 3B:
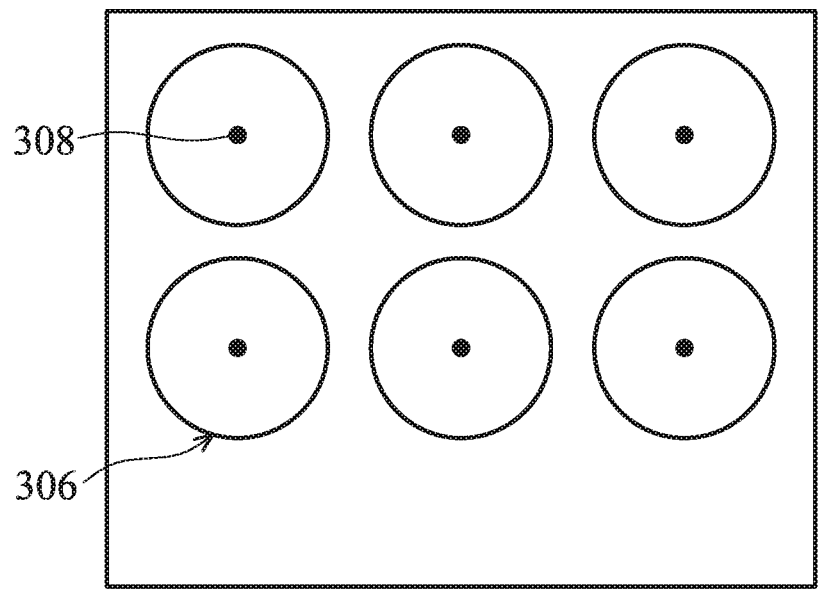
Figure 3C:
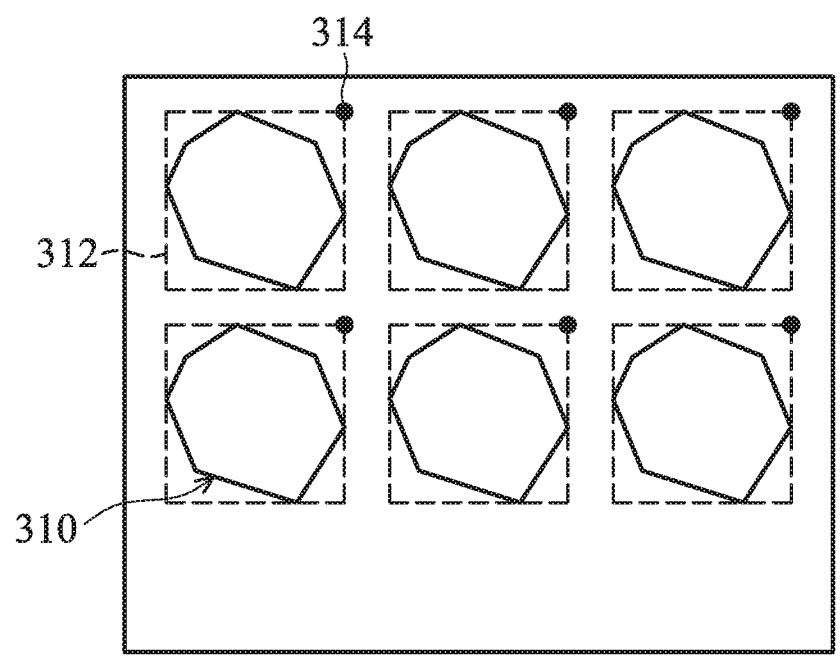

In addition, at least one of the first electronic units 208 has a reference point 216, and at least one of the second electronic units 210 has a reference point 218. It should be noted that the reference points are respectively in substantially the same position as the electronic units. In this embodiment, the reference point (e.g., the reference point 216) may be defined as one of the vertices of the electronic unit (e.g., the upper-right vertex of the electronic unit 208). In some embodiments, the reference point may be defined as the top point of the electronic unit in the direction 2. For example, as shown in FIG. 3A, the shape of the electronic unit 302 may be a rhombus and the top point of the electronic unit 302 in the direction 2 may be defined as the reference point 304. In some embodiments, the reference point may be defined as the center point of the electronic unit. For example, as shown in FIG. 3B, the shape of the electronic unit 306 is a circle, and the center point of the electronic unit 306 is defined as the reference point 308. In other embodiments, the reference point may be defined as one of the vertices of the smallest enclosing rectangle enclosing the electronic unit. For example, as shown in FIG. 3C, the shape of the electronic unit 306 is irregular, and one of the vertices of the smallest enclosing rectangle 312 (e.g., the upper-right vertex) of the electronic unit 310 may be used as the reference point 314. A side of the enclosing rectangle 312 may be extend along the direction 1 or a direction substantially perpendicular to the direction 1, but not limited thereto. In other examples, the reference point may be defined as the center point of the smallest enclosing rectangle 312.

Referring back to FIG. 2, adjacent two of the rows of the first electronic units 208 have a pitch $P_1$, and adjacent two of the columns of the first electronic units 208 have a pitch $P_3$. Similarly, adjacent two of the rows of the second electronic units 210 have a pitch $P_2$, and adjacent two of the columns of the second electronic units 210 have a pitch $P_4$.

The pitch $P_1$ may be defined by two adjacent first electronic units 208 respectively located in the row 1 (top row) and the row 2 in the first electronic module 204 along the direction 2. The pitch $P_2$ may be defined by two adjacent second electronic units 210 respectively located in the row 3 and the row 4 in the second electronic module 206 along the direction 2. For example, as shown in FIG. 2, the first electronic unit 208-1 in the row 1 and the first electronic unit 208-2 in the row 2 may define the pitch $P_1$. Specifically, the pitch $P_1$ may be defined as the distance from the reference point 216 of the first electronic unit 208-1 to the reference point 216 of the first electronic unit 208-2. Similarly, the second electronic unit 210-1 in the row 3 and the second electronic unit 210-2 in the row 4 may define the pitch $P_2$. Specifically, the pitch $P_2$ may be defined as the distance from the reference point 218 of the second electronic unit 210-1 to the reference point 218 of the second electronic unit 210-2.

In some aspects, the pitch $P_1$ may be defined by two adjacent first electronic units 208 located in the column 3 in the first electronic module 204 along the direction 2 and the pitch $P_2$ may be defined by two adjacent second electronic units 210 located in the column 4 in the second electronic module 206 along the direction 2.

The pitch $P_3$ may be defined by two adjacent first electronic units 208 located in the row 1 (top row) in the first electronic module 204 along the direction 1. The pitch $P_4$ may be defined by two adjacent second electronic units 210 located in the row 3 in the second electronic module 206 along the direction 1. For example, as shown in FIG. 2, the first electronic unit 208-1 and the first electronic unit 208-3 in the row 1 may define the pitch $P_3$. Specifically, the pitch $P_3$ may be defined as the distance from the reference point 216 of the first electronic unit 208-1 to the reference point 216 of the first electronic unit 208-3. Similarly, the second electronic unit 210-1 and the second electronic unit 210-3 in the row 3 may define the pitch $P_4$. Specifically, the pitch $P_4$ may be defined as the distance from the reference point 218 of the second electronic unit 210-1 to the reference point 218 of the second electronic unit 210-3.

In some aspects, the pitch $P_3$ may be defined by two adjacent first electronic units 208 respectively located in the column 2 and the column 3 in the first electronic module 204 along the direction 1. The pitch $P_4$ may be defined by two adjacent second electronic units 210 respectively located in the column 4 and the column 5 in the second electronic module 206 along the direction 1.

In this embodiment, the first electronic unit 208-1 may be the electronic unit in row 1 closest to the second electronic module 206 (or the edge 206-2 of the second electronic module 206) or the edge 204-2 of the first electronic module 204. In some aspects, the first electronic unit 208-1 may be the electronic unit closest to the corner of the first electronic module 204 constructed by the edge 204-1 connected to the edge 204-2. The second electronic unit 210-1 may be the electronic unit in the row 3 closest to the first electronic module 204 (or the edge 204-2 of the first electronic module 204) or the edge 206-2 of the second electronic module 206. In some aspects, the second electronic unit 210-1 is the electronic unit closest to the corner of the second electronic module 206 constructed by the edge 206-1 connected to the edge 206-2.

The first electronic unit 208-2 may be the electronic unit in the row 2 closest to the first electronic unit 208-1 in the row 1 in the direction 2, and the first electronic unit 208-2 may also be the electronic unit in the row 2 closest to the second electronic module 206 (or the edge 206-2 of the second electronic module 206) or the edge 204-2 of the first electronic module 204 in the direction 1. The second electronic unit 210-2 may be the electronic unit in the row 4 closest to the second electronic unit 210-1 in the row 3 in the direction 2, and the second electronic unit 210-2 may also be the electronic unit in the row 4 closest to the first electronic module 204 (or the edge 204-2 of the first electronic module 204) or the edge 206-2 of the second electronic module 206 in the direction 1. The first electronic unit 208-3 may be the electronic unit in the row 1 closest to the first electronic unit 208-1 in the row 1 in the direction 1. The second electronic unit 210-3 may be the electronic unit in the row 3 closest to the second electronic unit 210-1 in the row 3 in the direction 1.

Furthermore, the row 1 of the first electronic units 208 (e.g. the first electronic units 208-1, 208-3, and 208-5) may define a base line 212. The row 3 of the second electronic units 210 (e.g. the second electronic units 210-1, 210-3, and 210-5) may define a base line 214. Specifically, the reference points 216 of the row 1 of the first electronic units 208 may define the base line 212, and the reference points 218 of the row 3 of the second electronic units 210 may define the base line 214. In some aspects, the base line 212 may be a line that passes through the reference points 216 of the row 1 of the first electronic units 208, and the base line 214 may be a line that passes through the reference points 218 of the row 3 of the second electronic units 210. In the embodiment of FIG. 2, the base line 212 may be parallel to the base line 214, but not limited thereto.

The electronic device 200 may include a shifting design. In this embodiment, the first electronic units 208 may be a distance (shift) away from the second electronic units 210 in the direction 2. For example, the row 1 of the first electronic units 208 may have a shifting distance away from the row 3 of the second electronic units 210 in the direction 2, and the row 2 of the first electronic units 208 may have substantially the same shifting distance away from the row 4 of the second electronic units 210 in the direction 2. The shifting distance S may be between (or defined by) the base line 212 and the base line 214. Specifically, the shifting distance S may be the distance from the base line 212 to the base line 214 in the direction 2. Furthermore, the shifting distance S satisfies the following relation:

$$0<S\leq(P_1+P_2)/4,$$

wherein $P_1$ is the pitch $P_1$ discussed above (the length of the pitch $P_1$), $P_2$ is the pitch $P_2$ discussed above (the length of the pitch $P_2$). In some examples, the shifting distance S, the pitch $P_1$ and the pitch $P_2$ may have the same measurement unit, such as millimeter (mm) or micrometer (μm).

In a further embodiment, the shifting distance S satisfies the following relation:

$$(P_1+P_2)/6\leq S\leq(P_1+P_2)/4.$$

If the shifting distance S is less than $(P_1+P_2)/6$, the shift caused by the processing error discussed above will still be obvious. Furthermore, if the shifting distance S is greater than $(P_1+P_2)/4$, this shifting distance S of the shifting design will affect the image displayed by the electronic device 200.

In the embodiment of FIG. 2, the shifting design is the first electronic units 208 shifted upward (or the second electronic units 210 shifted downward). It should be understood that the shifting design may be the first electronic units 208 shifted downward (or the second electronic units 210 shifted upward) or shifted in other directions, and it is not limited thereto.

In some embodiments, the first electronic module 204 has a gap relative to the second electronic module 206. For example, as shown in FIG. 2, the first electronic module 204 is a gap distance G away from the second electronic module 206 in the direction 1. Specifically, the gap distance G may be defined as the smallest distance between the edge 204-2 of the first electronic module 204 and the edge 206-2 of the second electronic module 206 in the direction 1. Furthermore, the gap distance G satisfies the following relation:

$$0<G\leq(P_3+P_4)/4,$$

wherein $P_3$ is the pitch $P_3$ discussed above (the length of the pitch $P_3$), $P_4$ is the pitch $P_4$ discussed above (the length of the pitch $P_4$). In some examples, the gap distance G, the pitch $P_3$ and the pitch $P_4$ may have the same measurement unit, such as millimeter (mm) or micrometer m).

In a further embodiment, the gap distance G satisfies the following relation:

$$(P_3+P_4)/6\leq G\leq(P_3+P_4)/4.$$

Similarly, if the gap distance G is less than $(P_3+P_4)/6$, the shift caused by the processing error discussed above will still be obvious. Furthermore, if the gap distance G is greater than $(P_3+P_4)/4$, this gap distance G of the shifting design will affect the image displayed by the electronic device 200.

In cases where the length of the pitch $P_1$ is substantially the same as the length of the pitch $P_3$ and the length of the pitch $P_2$ is substantially the same as the length of the pitch $P_4$, the gap distance G may satisfy the following relation:

$$0<G\leq(P_1+P_2)/4, \text{ or}$$

$$(P_1+P_2)/6\leq G\leq(P_1+P_2)/4.$$

Figure 4:
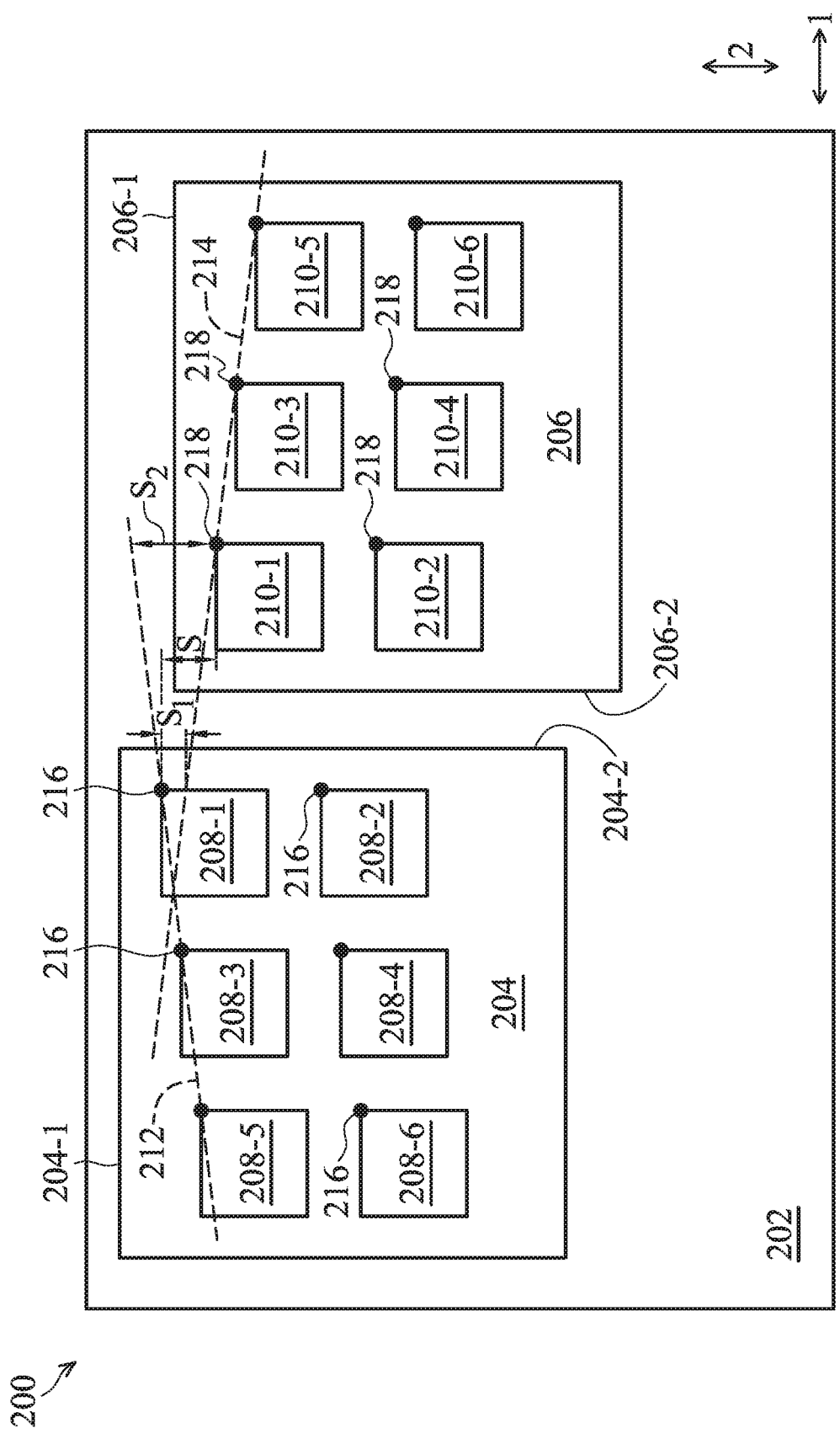
FIG. 4 is a schematic diagram of an electronic device with a shifting design, in accordance with some embodiments of the present disclosure.

In some embodiments, the base line 212 may intersect the base line 214 (i.e., the base line 212 may not be parallel to the base line 214), as shown in FIG. 4. In such cases, the shifting distance S (the distance from the reference point 216 of the first electronic unit 208-1 to the reference point 218 of the second electronic unit 210-1 in the direction 2) may be the average of a distance $S_1$ and a distance $S_2$ ($S=(S_1+S_2)/2$). The distance $S_1$ may be the distance from the reference point 216 of the first electronic unit 208-1 to the base line 214 in the direction 2. The distance $S_2$ may be the distance from the reference point 218 of the second electronic unit 210-1 to the base line 212 in the direction 2. As shown in FIG. 4, the reference point 216 of the first electronic unit 208-1 is a distance $S_1$ away from the base line 214 in the direction 2, and the reference point 218 of the second electronic unit 210-1 is a distance $S_2$ away from the base line 212 in the direction 2.

Figure 5:
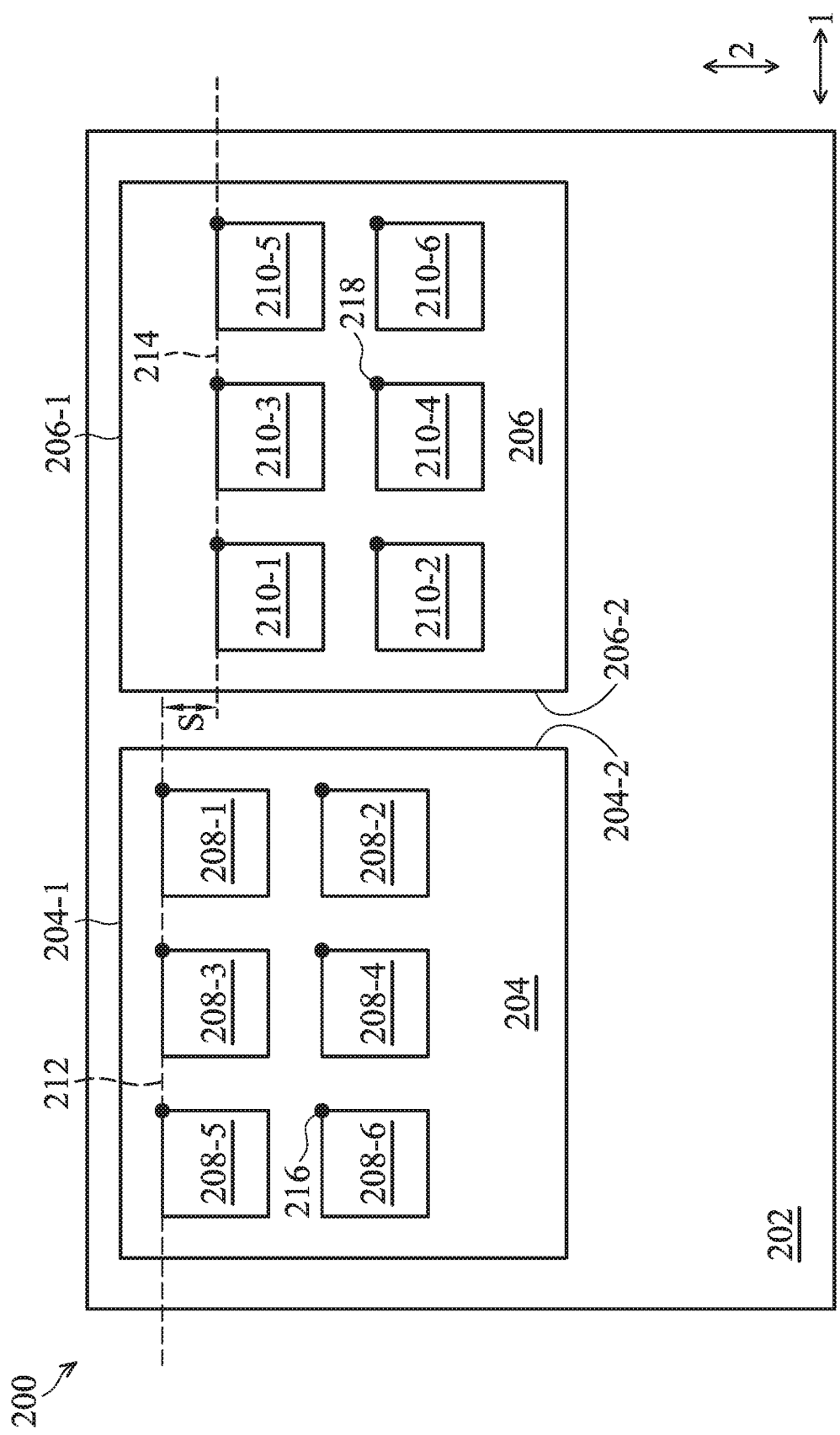
FIG. 5 is a schematic diagram of an electronic device with a shifting design, in accordance with some embodiments of the present disclosure.

As shown in FIG. 2, the arrangement of the first electronic units 208 in the first electronic module 204 may be substantially the same as the arrangement of the second electronic units 210 in the second electronic module 206. In some examples, when the first electronic units 208 have the shift relative to the second electronic units 210, the first electronic module 204 may also have a shift relative to the second electronic module 206. Specifically, the edge 204-1 of the first electronic module 204 and the edge 206-1 of the second electronic module 206 may not be aligned (i.e., the edge 204-1 of the first electronic module 204 has the shift relative to the edge 206-1 of the second electronic module 206). In some embodiments, the arrangement of the first electronic units 208 in the first electronic module 204 may be different from the arrangement of the second electronic units 210 in the second electronic module 206, as shown in FIG. 5. In such cases, the first electronic module 204 may be aligned with the second electronic module 206 (i.e., the edge 204-1 of the first electronic module 204 may be aligned with the edge 206-1 of the second electronic module 206). However, the first electronic units 208 may still have a shift relative to the second electronic units 210, and the shifting distance S of the shift satisfies the relation above.

Figure 6:
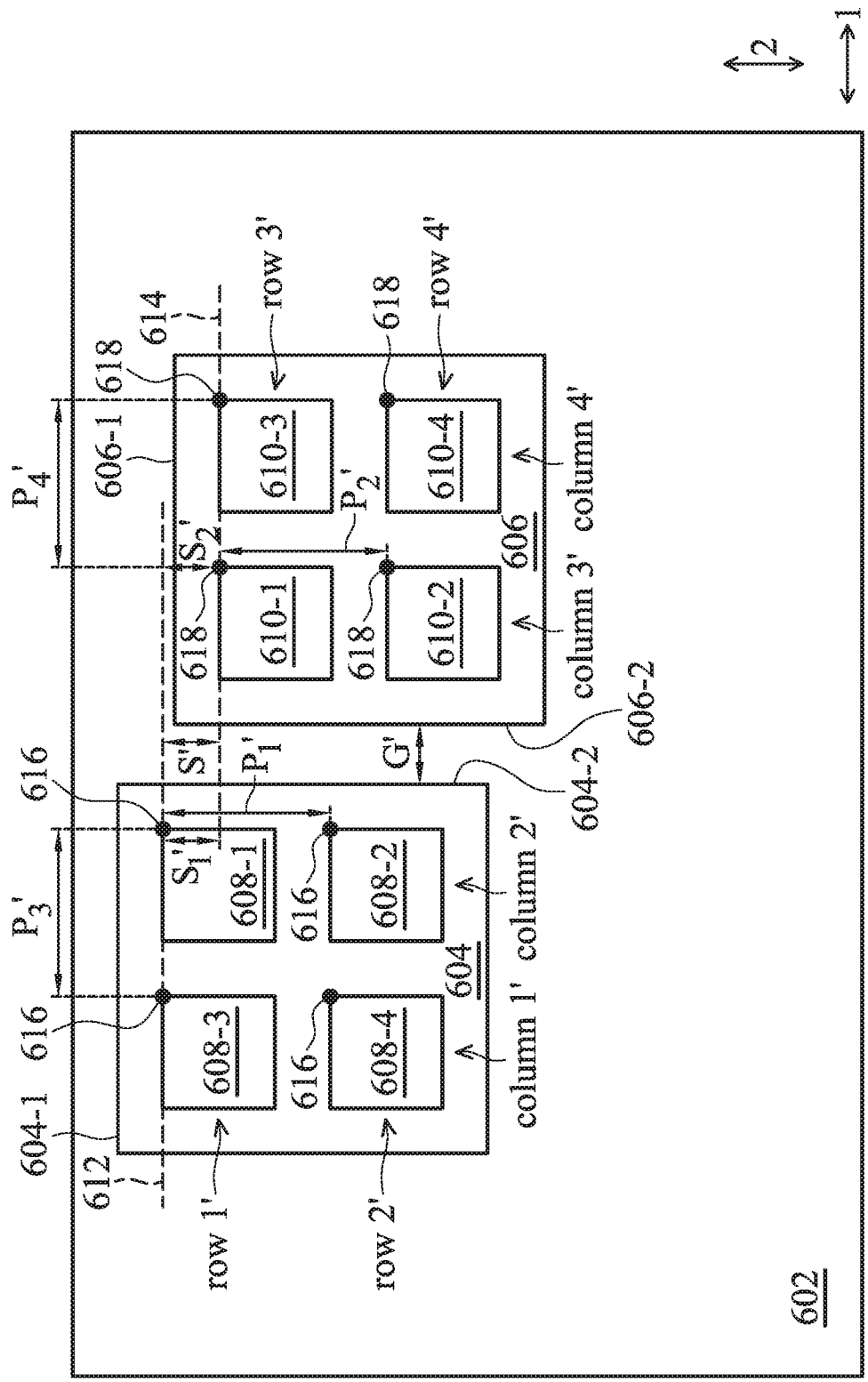
FIG. 6 is a schematic diagram of an electronic module with a shifting design in the electronic device, in accordance with some embodiments of the present disclosure.

In some embodiments, one electronic unit may include a plurality of electronic elements, such as chips or dies. The shifting design discussed above may also be applied to the electronic elements in the electronic unit. FIG. 6 is a schematic diagram of an electronic module 602 with a shifting design in the electronic device 200, in accordance with some embodiments of the present disclosure. The electronic module 602 includes an electronic unit 604 and an electronic unit 606. The electronic module 602 is similar to the first electronic module 204 and/or the second electronic module 206, which is not described in detail herein. The electronic unit 604 and the electronic unit 606 are similar to the first electronic units 208 and/or the second electronic units 210, which are not described in detail herein.

The electronic unit 604 and the electronic unit 606 may include a plurality of electronic elements 608 (i.e., the electronic elements 608-1 to 608-4) and a plurality of electronic elements 610 (i.e., the electronic elements 610-1 to 610-4). In the present disclosure, the sizes of the electronic elements 608 and the electronic elements 610 may be substantially the same. In this embodiment, the shapes of the electronic elements 608 and the electronic elements 610 may include square, but it is not limited thereto. For the purpose of clarity, the electronic unit 604 and the electronic unit 606 each may include four electronic elements. It should be understood that the electronic unit may have more or less electronic elements depending on the needs. For example, the electronic elements 608 and the electronic elements 610 may be light-emitting diode (LED) chips or dies, such as a red color LED chip, a green color LED chip, a blue color LED chip, a white color LED chip, or a combination thereof.

The electronic elements 608 may be arranged in an array in the electronic unit 604. The electronic elements 610 may be arranged in an array in the electronic unit 606. Specifically, in the electronic unit 604, the electronic elements 608 may be arranged in two rows (the rows 1' to 2' in the electronic unit 604) in the direction 1 and two columns (the columns 1' to 2' in the electronic unit 604) in the direction 2 (i.e., 2×2 array). Similarly, in the electronic unit 606, the electronic elements 610 are arranged in two rows (the rows 3' to 4' in the electronic unit 606) in the direction 1 and two columns (the columns 3' to 4' in the electronic unit 606) in the direction 2 (i.e., 2×2 array). In some aspects, one row of electronic elements 608 may be adjacent to another one in the direction 2 (i.e., in the electronic unit 604, the row 1' is adjacent to the row 2' in the direction 2). One row of electronic elements 610 may be adjacent to another one in the direction 2 (i.e., in the electronic unit 606, the row 3' is adjacent to the row 4' in the direction 2). The row 1' of the electronic elements 608 may be referred to as the top row of the electronic elements 608, and the row 1' is closest to the edge 604-1 of the electronic unit 604. Similarly, the row 3' of the electronic elements 610 may be referred to as the top row of the electronic elements 610, and the row 3' is closest to the edge 606-1 of the electronic unit 606.

In addition, the electronic elements 608 may have reference points 616, and the electronic elements 610 may have reference points 618. It should be noted that the reference points are respectively in substantially the same position as the electronic elements. In this embodiment, the reference point (e.g., the reference point 616) may be one of the vertices of the electronic element (e.g., the upper-right vertex of the electronic element 608). In some embodiments, the reference point may be the top point of the electronic element in the direction 2. In some embodiments, the reference point is the center point of the electronic element. In other embodiments, the reference point is one of the vertices of the smallest enclosing rectangle enclosing the electronic element.

Furthermore, adjacent two of the rows of the electronic elements 608 may have a pitch $P_1'$, and adjacent two of the columns of the electronic elements 608 may have a pitch $P_3'$. Similarly, adjacent two of the rows of the electronic elements 610 may have a pitch $P_2'$, and adjacent two of the columns of the electronic elements 610 may have a pitch $P_4'$.

The pitch $P_1'$ may be defined by two adjacent electronic elements 608 respectively located in the row 1' (the top row) and the row 2' in the electronic unit 604 along the direction 2. The pitch $P_2'$ may be defined by two adjacent electronic elements 610 respectively located in the row 3' (the top row) and the row 4' in the electronic unit 606 along the direction 2. For example, as shown in FIG. 6, the electronic element 608-1 in the row 1' and the electronic element 608-2 in the row 2' may define the pitch $P_1'$. Specifically, the pitch $P_1'$ may be defined as the distance from the reference point 616 of the electronic element 608-1 to the reference point 616 of the electronic element 608-2. Similarly, the electronic element 610-1 in the row 3' and the electronic element 610-2 in the row 4' may define the pitch $P_2'$. Specifically, the pitch $P_2'$ may be defined as the distance from the reference point 618 of the electronic element 610-1 to the reference point 618 of the electronic element 610-2.

In some aspects, the pitch $P_1'$ may be defined by two adjacent electronic elements 608 located in the column 2' in the electronic unit 604 along the direction 2, and the pitch $P_2'$ may be defined by two adjacent electronic elements 610 located in the column 3' in the electronic unit 606 along the direction 2, but it is not limited thereto. In some examples, the pitch may be defined by two adjacent electronic elements located in the column, and the column may be adjacent to the edge of the electronic unit.

The pitch $P_3'$ may be defined by two adjacent electronic elements 608 located in the row 1' (the top row) in the electronic unit 604 along the direction 1. The pitch $P_4'$ may be defined by two adjacent electronic elements 610 located in the row 3' in the electronic unit 606 along the direction 1. For example, as shown in FIG. 6, the electronic element 608-1 and the electronic element 608-3 in the row 1' may define the pitch $P_3'$. Specifically, the pitch $P_3'$ may be defined as the distance from the reference point 616 of the electronic element 608-1 to the reference point 616 of the electronic element 608-3. Similarly, the electronic element 610-1 and the electronic element 610-3 in the row 3' may define the pitch $P_4'$. Specifically, the pitch $P_4'$ may be defined as the distance from the reference point 618 of the electronic element 610-1 to the reference point 618 of the electronic element 610-3.

In some aspects, the pitch $P_3'$ may be defined by two adjacent electronic elements 608 respectively located in the column 1' and the column 2' in the electronic unit 604 along the direction 1. The pitch $P_4'$ may be defined by two adjacent electronic elements 610 respectively located in the column 3' and the column 4' in the electronic unit 606 along the direction 1.

In this embodiment, the electronic element 608-1 may be the electronic element in the row 1' that is the closest to the electronic unit 606 (or the edge 606-2 of the electronic unit 606) or the edge 604-2 of the electronic unit 604. In some aspects, the electronic element 608-1 may be the closest electronic element to the upper-right corner of the electronic unit 604 constructed by the edge 604-1 connected to the edge 604-2. The electronic element 610-1 may be the electronic element in the row 3' that is the closest to the electronic unit 604 (or the edge 604-2 of the electronic unit 604) or the edge 606-2 of the electronic unit 606. In some aspects, the electronic element 610-1 may be the closest electronic element to the upper-left corner of the electronic unit 606 constructed by the edge 606-1 connected to the edge 606-2.

The electronic element 608-2 may be the electronic element in the row 2' that is the closest to the electronic element 608-1 in the row 1' in the direction 2, as well as to the electronic unit 606 (or the edge 606-2 of the electronic unit 606) or the edge 604-2 of the electronic unit 604 in the direction 1. The electronic element 610-2 may be the electronic element in the row 4' that is the closest to the electronic element 610-1 in the row 3' in the direction 2, as well as to the electronic unit 604 (or the edge 604-2 of the electronic unit 604) or the edge 606-2 of the electronic unit 606 in the direction 1. The electronic element 608-3 may be the closest electronic element in the row 1' to the electronic element 608-1 in the row 1' in the direction 1. The electronic element 610-3 may be the closest electronic element in the row 3' to the electronic element 610-1 in the row 3' in the direction 1.

Furthermore, the row 1' of the electronic elements 608 (the electronic elements 608-1 and 608-3) may define a base line 612. The row 3' of the electronic elements 610 (the electronic elements 610-1 and 610-3) may define a base line 614. Specifically, the reference points 616 of the row 1' of the electronic elements 608 may define a base line 612, and the reference points 618 of the row 3' of the electronic elements 610 may define a base line 614. In some aspects, the base line 612 may be a line passing through the reference points 616 of the row 1 of the electronic elements 608, and the base line 614 may be a line passing through the reference points 618 of the row 3 of the electronic elements 610. In the embodiment of FIG. 6, the base line 612 may be substantially parallel to the base line 614.

The electronic module 602 may include a shifting design. In this embodiment, the electronic elements 608 may be a distance (shift) away from the electronic elements 610 in the direction 2. For example, the row 1' of the electronic elements 608 may have a shifting distance away from the row 3' of the electronic elements 610 in the direction 2. The row 2' of the electronic elements 608 may have substantially the same shifting distance away from the row 4' of the electronic elements 610 in the direction 2. The shifting distance S' may be between (or defined by) the base line 612 and the base line 614. Specifically, the shifting distance S' may be the distance from the base line 612 to the base line 614 in the direction 2. Furthermore, the shifting distance S' satisfies the following relation:

$$0<S'\leq(P_1'+P_2')/4,$$

wherein $P_1'$ is the pitch $P_1'$ discussed above (the length of the pitch $P_1'$), $P_2'$ is the pitch $P_2'$ discussed above (the length of the pitch $P_2'$). In some examples, the shifting distance S', the pitch $P_1'$ and the pitch $P_2'$ may have the same measurement unit, such as millimeter (mm) or micrometer (μm).

In a further embodiment, the shifting distance S' satisfies the following relation:

$$(P_1'+P_2')/6\leq S'\leq(P_1'+P_2')/4.$$

If the shifting distance S' is less than $(P_1'+P_2')/6$, the shift caused by the processing error discussed above will still be obvious. Furthermore, if the shifting distance S' is greater than $(P_1'+P_2')/4$, this shifting distance S' of the shifting design will affect the image displayed by the electronic device 200.

In the embodiment of FIG. 6, the shifting design may be the electronic elements 608 shifted upward (or the electronic elements 610 shifted downward). It should be understood that the shifting design may be the electronic elements 608 shifted downward (or the electronic elements 610 shifted upward) or shifted in other directions, but it is not limited thereto.

In some embodiments, the electronic unit 604 has a gap relative to the electronic unit 606. For example, as shown in FIG. 6, the electronic unit 604 is a gap distance G' away from the electronic unit 606 in the direction 1. Specifically, the gap distance G' is the smallest distance from the edge 604-2 of the electronic unit 604 to the edge 606-2 of the electronic unit 606 in the direction 1. Furthermore, the gap distance G' satisfies the following relation:

$$0<G'\leq(P_3'+P_4')/4,$$

wherein $P_3'$ is the pitch $P_3'$ discussed above (the length of the pitch $P_3'$), $P_4'$ is the pitch $P_4'$ discussed above (the length of the pitch $P_4'$). In some examples, the gap distance G', the pitch $P_3'$ and the pitch $P_4'$ may have the same measurement unit, such as millimeter (mm) or micrometer (μm).

In a further embodiment, the gap distance G' satisfies the following relation:

$$(P_3'+P_4')/6\leq G'\leq(P_3'+P_4')/4.$$

Similarly, if the gap distance G' is less than $(P_3'+P_4')/6$, the shift caused by the processing error discussed above will still be obvious. Furthermore, if the gap distance G' is greater than $(P_3'+P_4')/4$, this gap distance G' of the shifting design will affect the image displayed by the electronic device 200.

In cases where the length of the pitch $P_1'$ may be substantially the same as the length of the pitch $P_3'$ and the length of the pitch $P_2'$ may be substantially the same as the length of the pitch $P_4'$, the gap distance G' satisfies the following relation:

$$0<G'\leq(P_1'+P_2')/4, \text{ or}$$

$$(P_1'+P_2')/6\leq G'\leq(P_1'+P_2')/4.$$

In some embodiments, the base line 612 may intersect the base line 614 (i.e., base line 612 may be not parallel to and base line 614) (not shown). In this case, the shifting distance S' (the distance from the reference point 616 of the electronic unit 608-1 to the reference point 618 of the electronic unit 610-1 in the direction 2) may be the average of the distance $S_1'$ and the distance $S_2'$ ($S'=(S_1'+S_2')/2$). The distance $S_1'$ may be the distance from the reference point 616 of the electronic element 608-1 to the base line 614 in the direction 2, and the distance $S_2'$ may be the distance from the reference point 618 of the electronic element 610-1 to the base line 612 in the direction 2.

Figure 7:
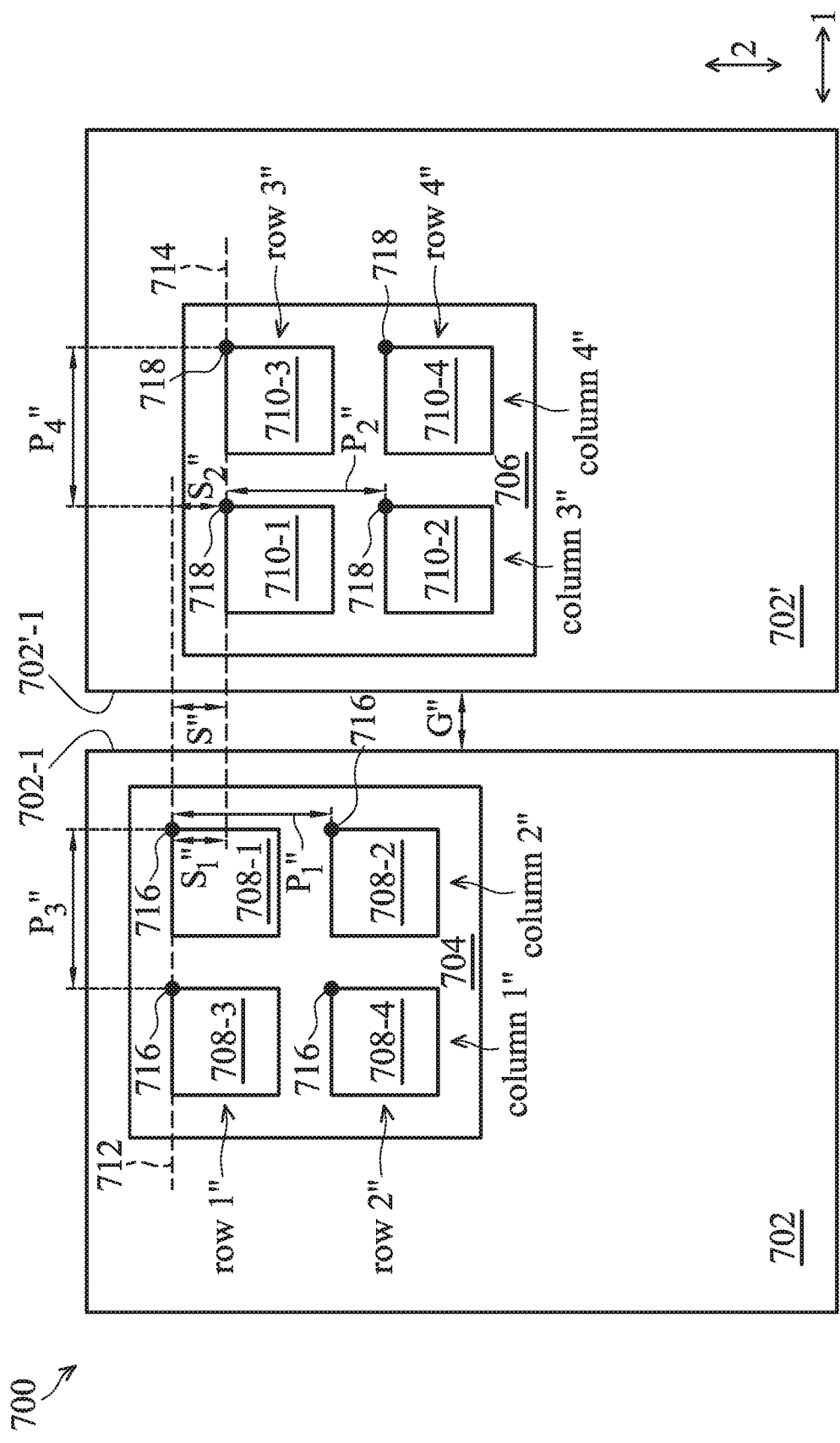
FIG. 7 is a schematic diagram of an electronic system with a shifting design, in accordance with some embodiments of the present disclosure.

The shifting design discussed above may also be applied to an electronic system. FIG. 7 is a schematic diagram of an electronic system with a shifting design, in accordance with some embodiments of the present disclosure. The electronic system 700 may include an electronic device 702 and an electronic device 702'. The electronic device 702 may include a first electronic module 704, and the electronic device 702' may include a second electronic module 706. The electronic system 700 may be a video wall, public information display (PID), an antenna system, a sensing system, or a combination thereof.

The electronic device 702 and the electronic device 702' may be similar to or substantially the same as the electronic device 200. The first electronic module 704 and the second electronic module 706 may be similar to or substantially the same as the first electronic module 204 and the second electronic module 206, which is not described in detail herein.

The first electronic module 704 may include a plurality of first electronic units 708 (i.e., the first electronic units 708-1 to 708-4). The second electronic module 706 may include a plurality of second electronic units 710 (i.e., the second electronic units 710-1 to 710-4). The first electronic units 708 and the second electronic units 710 may be similar to or substantially the same as the first electronic units 208 and the second electronic units 210, which is not described in detail herein. The first electronic units 708 may have reference points 716, and the second electronic units 710 may have reference points 718. The reference point 716 and reference point 718 may be similar to or substantially the same as the reference point 216 and reference point 218, which is not described in detail herein.

Adjacent two of the rows (e.g., the row 1" and the row 2") of the electronic units 708 may have a pitch $P_1''$, and adjacent two of the columns (e.g., the column 1" and the column 2") of the electronic units 708 may have a pitch $P_3''$. Similarly, adjacent two of the rows (e.g., the row 3" and the row 4") of the electronic units 710 may have a pitch $P_2''$, and adjacent two of the columns (e.g., the column 3" and the column 4") of the electronic units 710 may have a pitch $P_4''$. The pitches $P_1''$, $P_2''$, $P_3''$, and $P_4''$ may be similar to or substantially the same as the pitches $P_1$, $P_2$, $P_3$, and $P_4$. Similar to the embodiment in FIG. 2, the row 1" of the electronic units 708 (e.g. the electronic units 708-1 and 708-3) may define a base line 712, and the row 3" of the electronic units 710 (e.g. the electronic units 710-1 and 710-3) may define a base line 714. In the embodiment of FIG. 7, the base line 712 may be parallel to the base line 714.

The electronic system 700 has a shifting design. In this embodiment, the electronic unit 708 may be a distance (shift) away from the electronic unit 710 in the direction 2. For example, the row 1" of the electronic units 708 may have a shifting distance away from the row 3" of the electronic units 710 in the direction 2. The row 2" of the electronic units 708 may have a shifting distance away from the row 4"

of the electronic units 710 in the direction 2. The shifting distance S" may be between (or defined by) the base line 712 and the base line 714. Specifically, the shifting distance S" may be the distance from the base line 712 to the base line 714 in the direction 2. Furthermore, the shifting distance S" satisfies the following relation:

$$0 < S'' \leq (P_1'' + P_2'')/4,$$

wherein $P_1''$ is the pitch $P_1''$ discussed above (the length of the pitch $P_1''$), $P_2''$ is the pitch $P_2''$ discussed above (the length of the pitch $P_2''$). In some examples, the shifting distance S", the pitch $P_1''$ and the pitch $P_2''$ may have the same measurement unit, such as millimeter (mm) or micrometer (μm).

In a further embodiment, the shifting distance S" satisfies the following relation:

$$(P_1'' + P_2'')/6 \leq S'' \leq (P_1'' + P_2'')/4.$$

If the shifting distance S is less than $(P_1'' + P_2'')/6$, the shift caused by the processing error discussed above will still be obvious. Furthermore, if the shifting distance S is greater than $(P_1'' + P_2'')/4$, this shifting distance S" of the shifting design will affect the image displayed by the electronic system 700.

In the embodiment of FIG. 7, the shifting design may include the electronic units 708 shifted upward (or the electronic units 710 shifted downward). It should be understood that the shifting design may include the electronic units 708 shifted downward (or the electronic units 710 shifted upward). In other examples, the electronic units 708 may be shifted in other directions.

In some embodiments, in the electronic system 700, the electronic device 702 has a gap relative to the electronic device 702'. For example, as shown in FIG. 7, the electronic device 702 is a gap distance G" away from the electronic device 702' in the direction 1. Specifically, the gap distance G" is the smallest distance from the edge 702-1 of the electronic device 702 to the edge 702'-1 of the electronic device 702' in the direction 1. Furthermore, the gap distance G" satisfies the following relation:

$$0 < G'' \leq (P_3'' + P_4'')/4,$$

wherein $P_3''$ is the pitch $P_3''$ discussed above (the length of the pitch $P_3''$), $P_4''$ is the pitch $P_4''$ discussed above (the length of the pitch $P_4''$). In some examples, the gap distance G", the pitch $P_3''$ and the pitch $P_4''$ may have the same measurement unit, such as millimeter (mm) or micrometer (μm).

In a further embodiment, the gap distance G satisfies the following relation:

$$(P_3'' + P_4'')/6 \leq G'' \leq (P_3'' + P_4'')/4.$$

Similarly, if the gap distance G" is less than $(P_3'' + P_4'')/6$, the shift caused by the processing error discussed above will still be obvious. Furthermore, if the gap distance G" is greater than $(P_3'' + P_4'')/4$, this gap distance G" of the shifting design will affect the image displayed by the electronic system 700.

In cases where the length of the pitch $P_1''$ may be substantially the same as the length of the pitch $P_3''$ and the length of the pitch $P_2''$ may be substantially the same as the length of the pitch $P_4''$, the gap distance G" satisfies the following relation:

$$0 < G'' \leq (P_1'' + P_2'')/4, \text{ or}$$

$$(P_1'' + P_2'')/6 \leq G'' \leq (P_1'' + P_2'')/4.$$

In some embodiments, the base line 712 may intersect the base line 714 (i.e., the base line 712 may not be parallel to the base line 714) (not shown). In such cases, the shifting distance S" (the distance from the reference point 716 of the first electronic unit 708-1 to the reference point 718 of the second electronic unit 710-1 in the direction 2) is the average of a distance $S_1''$ and a distance $S_2''$ ($S'' = (S_1'' + S_2'')/2$). The distance $S_1''$ may be the distance from the reference point 716 of the first electronic unit 708-1 to the base line 714 in the direction 2, and the distance $S_2''$ may be the distance from the reference point 718 of the second electronic unit 710-1 to the base line 712 in the direction 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   an electronic module, comprising:
   a first electronic unit, the first electronic unit comprising a plurality of first electronic elements arranged in a plurality of rows, wherein a top row of the plurality of first electronic elements defines a first base line; and
   a second electronic unit, the second electronic unit comprising a plurality of second electronic elements arranged in a plurality of rows, wherein a top row of the plurality of second electronic elements defines a second base line;
   wherein a shifting distance S between the first base line and the second base line satisfies the following relation:

$$0 < S \leq (P_1 + P_2)/4,$$

wherein $P_1$ is a pitch defined by two adjacent first electronic elements located in the top row and its adjacent row, and $P_2$ is a pitch defined by two adjacent second electronic elements located in the top row and its adjacent row.

2. The electronic device as claimed in claim 1, wherein the shifting distance S further satisfies the following relation:

$$(P_1 + P_2)/6 \leq S \leq (P_1 + P_2)/4.$$

3. The electronic device as claimed in claim 1, wherein a gap distance G between the first electronic unit and the second electronic unit satisfies the following relation:

$$0 < G \leq (P_1 + P_2)/4.$$

4. The electronic device as claimed in claim 3, wherein the gap distance G further satisfies the following relation:

$$(P_1 + P_2)/6 \leq G \leq (P_1 + P_2)/4.$$

5. The electronic device as claimed in claim 1, wherein the first electronic unit and the second electronic unit are light-emitting diodes, sensors, antenna units, or a combination thereof.

6. The electronic device as claimed in claim 1, wherein the first electronic elements and the second electronic elements are combinations of light-emitting diode chips and light-emitting diode dies.

7. The electronic device as claimed in claim 1, wherein the first electronic unit is adjacent to the second electronic unit in a first direction, and there is a gap distance between the first electronic unit and the second electronic unit in the first direction,
wherein the plurality of rows of the first electronic elements are arranged along a second direction, and the plurality of rows of the second electronic elements are arranged along the second direction, and the first direction is perpendicular to the second direction.

8. The electronic device as claimed in claim 7, wherein each of the first electronic elements has a first reference point, and each of the second electronic elements has a second reference point,
wherein the first reference points of the top row of first electronic elements define the first base line, and the second reference points of the top row of second electronic elements define the second base line.

9. The electronic device as claimed in claim 8, wherein the first reference point is a top point of each of the first electronic elements in the second direction, and the second reference point is a top point of each of the second electronic elements in the second direction.

10. The electronic device as claimed in claim 8, wherein the first reference point is a center point of each of the first electronic elements, and the second reference point is a center point of each of the second electronic elements.

11. The electronic device as claimed in claim 8, wherein the first reference point is a vertex of an enclosing rectangle of each of the first electronic elements, and the second reference point is a vertex of an enclosing rectangle of each of the second electronic elements.

12. The electronic device as claimed in claim 8, wherein the first base line intersects the second base line.

13. The electronic device as claimed in claim 12, wherein:
the first reference point of a third electronic element of the top row of first electronic elements is a first distance $S_1$ away from the second base line, wherein the third electronic element is the closest electronic element to the second electronic unit in the top row of first electronic elements; and
the second reference point of a fourth electronic element of the top row of second electronic elements is a second distance $S_2$ away from the first base line, wherein the fourth electronic element is the closest electronic element to the first electronic unit in the top row of second electronic elements,
wherein the shifting distance S follows the relation below:

$$S=(S_1+S_2)/2.$$

14. The electronic device as claimed in claim 13, wherein the first distance $S_1$ is the distance from the first reference point of the third electronic element to the second base line in the second direction, and the second distance $S_2$ is the distance from the second reference point of the fourth electronic element to the first base line in the second direction.

15. The electronic device as claimed in claim 13, wherein $P_1$ is a pitch defined by the third electronic element and a fifth electronic element, the fifth electronic element is the closest electronic element to the third electronic element in a row of first electronic elements adjacent to the top row of first electronic elements in the second direction, and
$P_2$ is a pitch defined by the fourth electronic element and a sixth electronic element, the sixth electronic element is the closest electronic element to the fourth electronic element in a row of first electronic elements adjacent to the top row of second electronic elements in the second direction.

16. The electronic device as claimed in claim 15, wherein a length of $P_1$ is a distance from the first reference point of the third electronic element to the first reference point of the fifth electronic element, and a length of $P_2$ is a distance from the second reference point of the fourth electronic element to the second reference point of the sixth electronic element.

17. The electronic device as claimed in claim 13, wherein two adjacent first electronic elements located in the top row of first electronic elements have a pitch $P_3$, and two adjacent second electronic elements located in the top row of second electronic elements have a pitch $P_4$,
wherein the first electronic unit is a distance G away from the second electronic unit in the first direction, wherein the distance G satisfies the following relation:

$$0<G\leq(P_3+P_4)/4.$$

18. The electronic device as claimed in claim 17, wherein the distance G further satisfies the following relation:

$$(P_3+P_4)/6\leq G\leq(P_3+P_4)/4.$$

19. The electronic device as claimed in claim 17, wherein $P_3$ is a pitch defined by the third electronic element and a seventh electronic element, and the seventh electronic element is the closest electronic element to the third electronic element in the top row of first electronic elements in the first direction, and
$P_4$ is a pitch defined by the fourth electronic element and an eighth electronic element, and the eighth electronic element is the closest electronic element to the fourth electronic element in the top row of second electronic elements in the first direction.

20. The electronic device as claimed in claim 19, wherein a length of $P_3$ is a distance from the first reference point of the third electronic element to the first reference point of the seventh electronic element, and a length of $P_4$ is a distance from the second reference point of the fourth electronic element to the second reference point of the eighth electronic element.

* * * * *